United States Patent [19]
Sher et al.

[11] Patent Number: 5,896,041
[45] Date of Patent: Apr. 20, 1999

[54] METHOD AND APPARATUS FOR PROGRAMMING ANTI-FUSES USING INTERNALLY GENERATED PROGRAMMING VOLTAGE

[75] Inventors: Joseph C. Sher; Eric J. Smith, both of Boise, Id.

[73] Assignee: Micron Technology, Inc., Boise, Id.

[21] Appl. No.: 08/654,338

[22] Filed: May 28, 1996

[51] Int. Cl.⁶ .................................................... H01H 85/00
[52] U.S. Cl. ........................................... 326/38; 327/525
[58] Field of Search ................................ 326/38, 49–50, 326/44–45, 88; 327/525, 536; 365/230.06

[56] References Cited

U.S. PATENT DOCUMENTS

| | | | |
|---|---|---|---|
| 4,730,129 | 3/1988 | Kunitoki et al. | 327/525 |
| 4,775,959 | 10/1988 | Sato et al. | 365/189 |
| 5,130,777 | 7/1992 | Galbraith et al. | 365/225.7 |
| 5,191,550 | 3/1993 | Kubota | 365/96 |
| 5,243,226 | 9/1993 | Chan | 326/38 |
| 5,257,222 | 10/1993 | Lee | 365/225.7 |
| 5,299,151 | 3/1994 | Ishihara et al. | 365/225.7 |
| 5,299,152 | 3/1994 | Ishihara et al. | 365/225.7 |
| 5,301,159 | 4/1994 | Lee | 365/225.7 |
| 5,311,480 | 5/1994 | Schreck | 365/230.06 |
| 5,316,971 | 5/1994 | Chiang et al. | 437/170 |
| 5,319,592 | 6/1994 | Nguyen | 365/96 |
| 5,392,253 | 2/1995 | Atsumi et al. | 365/230.06 |
| 5,404,049 | 4/1995 | Canada et al. | 326/38 |
| 5,412,593 | 5/1995 | Magel et al. | 365/225.7 |
| 5,426,614 | 6/1995 | Harward | 365/225.7 |
| 5,469,396 | 11/1995 | Eltoukhy | 365/225.7 |
| 5,495,436 | 2/1996 | Callahan | 365/225.7 |
| 5,514,980 | 5/1996 | Pilling et al. | 326/38 |

FOREIGN PATENT DOCUMENTS

| | | |
|---|---|---|
| 0 436 247 | 7/1991 | European Pat. Off. |
| 58-021856 | 2/1983 | Japan |

OTHER PUBLICATIONS

Calligaro et al., "Positive and Negative CMOS Voltage Multiplier for 5–V–Only Flash Memories" *38th Midwest Symposium on Circuits and Systems: Proceedings, Rio De Janeiro,* 1(38): 294–297, 1995.

*Primary Examiner*—Jon Santamauro
*Attorney, Agent, or Firm*—Seed and Berry LLP

[57] ABSTRACT

A programming circuit for an anti-fuse utilizes a boot circuit that charges a capacitor to the supply voltage during a non-programming period. Anti-fuse is to be programmed, the plate of the capacitor to which the supply voltage has been applied is switched to 0 volts, thereby causing the other plate of the capacitor to output a negative voltage. This negative voltage is switched to one plate of an anti-fuse, and the other plate of the anti-fuse receives a positive voltage from an external source. A voltage is thereby applied across the anti-fuse that is greater than any voltage applied to any node of the integrated circuit.

19 Claims, 3 Drawing Sheets

METHOD AND APPARATUS FOR PROGRAMMING ANTI-FUSES USING INTERNALLY GENERATED PROGRAMMING VOLTAGE

TECHNICAL FIELD

The present invention relates to programming anti-fuses in semiconductor circuits, and more particularly to a method and apparatus for programming anti-fuses with a sufficiently high voltage to provide a consistently low resistance of the programmed anti-fuse without overstressing other components of the integrated circuit.

BACKGROUND OF THE INVENTION

Anti-fuses are a common component in conventional integrated circuits. An anti-fuse is a circuit element that is normally open circuited until it is programmed at which point the anti-fuse assumes a relatively low resistance. Anti-fuses are commonly used to selectively enable certain features of integrated circuits and to perform repairs of integrated circuits. Repairs of integrated circuits are typically accomplished by "blowing" anti-fuses to signal defective portions of the integrated circuit that they should be replaced with redundant circuits. For example, a defective row of memory cells in the array of a dynamic random access memory can be replaced with a redundant row of cells provided for that purpose.

Conventional anti-fuses are similar in construction to capacitors in that they include a pair of conductive plates separated from each other by a dielectric or insulator. Anti-fuses are typically characterized by the nature of the dielectric which may be, for example, oxide or nitride. Anti-fuses are programmed or "blown" by applying a differential voltage between the plates that is sufficient to break down the dielectric thereby causing the plates to contact each other. Typically this relatively high programming voltage is applied to the chip externally through terminals that are normally used for other purposes. For example, in a DRAM, a high voltage may be applied to one of the data bit terminals after the integrated circuit has been placed in a programming mode by, for example, applying a predetermined combination of bits to other terminals of the integrated circuit.

Although conventional anti-fuses as described above have worked well in many applications, they nevertheless have several shortcomings, particularly when used in more recent, high density integrated circuits. In particular, the programmed resistance of anti-fuses varies over a considerable range, and the programmed resistance is often far higher than is desired. For example, sometimes the programmed resistance is high enough that circuitry connected to the anti-fuse mistakenly determines that the anti-fuse is open circuited. It is generally known that programming anti-fuses with a higher voltage will both lower the programmed resistance and provide a more uniform resistance. However, the magnitude of the programming voltage that can be applied to anti-fuses is severely limited by the presence of other circuitry in the integrated circuit. In particular, since the terminals on which the programming voltage is applied are typically used for other functions, excessive programming voltages can easily break down the gate oxide layers of MOSFET's connected to such terminal thereby making such transistors defective. The problem of programming voltages breaking down the gate oxide layer of MOSFET's is exacerbated by the wide range of operating voltages of typical integrated circuits. For example, recent integrated circuits are capable of operating with a supply voltage of 3.3 volts in order to minimize power consumption, but they must still be able to operate with a commonly used supply voltage of 5 volts.

Excessive programming voltages can also exceed the breakdown voltage of bipolar transistors that are connected to the input terminals of integrated circuits to provide electrostatic discharge ("ESD") protection for the remaining components of the integrated circuit. While this problem can be alleviated to some extent by increasing the breakdown voltage of the bipolar ESD protection transistors, doing so reduces the safety margin of the ESD protection. While the problem of breaking down gate oxide layers of MOSFET's and exceeding the breakdown voltage of bipolar ESD protection transistors could be alleviated to some extent by using dedicated terminals to program anti-fuses, the problem would nevertheless remain because it would be difficult to isolate the programming voltage from the integrated circuit substrate. If the programming voltage was coupled to the integrated circuit substrate, excessive voltages could still be coupled across the gate oxide layers of MOSFET's, even though the programming voltage was not applied directly to the gates of the transistors.

A conventional circuit 10 for programming and reading the state of an anti-fuse is illustrated in FIG. 1. As shown in FIG. 1, an anti-fuse 12 is in the form of an NMOS transistor 12 having its gate connected to the circuit ground CGRN input and its source and drain connected to each other. However, other varieties of anti-fuses, such as parallel plates separated by a dielectric, may also be programmed and read using the circuit shown in FIG. 1. The circuit 10 also receives an active low programming input PRG* and an active low address match input AM* which are applied to the inputs of a NOR gate 14. The output of the NOR gate 14 is applied to the gate of an NMOS transistor 16 which is connected between ground and the anti-fuse 12 through an NMOS transistor 18. The gate of the NMOS transistor 18 is biased to the supply voltage so that the NMOS transistor 18 is conductive whenever the NMOS transistor 16 is conductive. However, during normal operation PRG* and/or AM* are high thus turning off the NMOS transistor 16 to effectively isolate the anti-fuse from ground.

In normal operation, the circuit ground CGRN input is connected to ground. The status of the anti-fuse 12 is read by inputting a high fuse read "FR" input to an NMOS transistor 30. The drain of the NMOS transistor 30 is connected to the drain of a PMOS transistor 32 which is biased on so that it essentially acts as a resistor connected between the supply voltage and the drain of the NMOS transistor 30. Thus, when the fuse read FR input goes high, the NMOS transistor 30 applies the supply voltage to the anti-fuse 12 through the PMOS transistor 32. The PMOS transistor 32 and the anti-fuse 12 thus essentially form a voltage divider having an output at the drain of the PMOS transistor 32 which is connected to the input of an inverter 40.

The channel length to width ratio of the PMOS transistor 32 is selected so that, when the anti-fuse 12 is blown, a low logic level will be applied to the input of the inverter 40. Conversely, when the anti-fuse 12 is not blown, a high logic level will be applied to the input of the inverter 40. The FOUT output of the inverter 40 thus provides an indication of the state of the anti-fuse 12 when a high fuse read FR input is applied to the circuit 10.

When the anti-fuse 12 is to be programmed, the program PRG* and address match AM* inputs both go low thereby causing the NOR gate 14 to output a logic high. This logic high turns on the NMOS transistor 16 thereby grounding through NMOS transistor 18 the plate of the anti-fuse 12 formed by the source and drain of the NMOS transistor. A positive voltage is then applied to the circuit ground CGRN input thereby placing a voltage across the anti-fuse 12 equal to the value of the programming voltage applied to the circuit ground CGRN input.

It will be understood that the prior art circuitry shown in FIG. 1 is integrated into additional circuitry that interfaces with the anti-fuse 12. However, this additional circuitry has been omitted for purposes of brevity and clarity.

The principal disadvantage of the prior art circuit 10 shown in FIG. 1 is that the differential voltage across the anti-fuse 12 is limited to the value of the programming voltage applied to the circuit ground CGRN input. If the programming voltage is increased sufficiently to consistently program the anti-fuse 12 to a relatively low resistance, the programming voltage may very well break down the gate oxide layer of MOSFET's (not shown) in the integrated circuit or make exceed the breakdown voltage of bipolar electrostatic discharge protection ("ESD") transistors thereby causing transistors to limit the programming voltage to the snap back voltage of the ESD transistors.

There is therefore a need for a method and apparatus for programming anti-fuses with a relatively high voltage in a manner that does not damage other components in an integrated circuit.

SUMMARY OF THE INVENTION

In accordance with the inventive method and apparatus for programming an anti-fuse formed in an integrated circuit, a positive voltage is applied to a first terminal of an anti-fuse, and a negative voltage is applied to a second terminal of the anti-fuse. As a result, the voltage applied across the first and second terminals of the anti-fuse is greater than either the positive voltage or the negative voltage. Either or both of the positive and negative voltages can be applied from either a source external to the integrated circuit or from a voltage generator internal to the integrated circuit. A positive or negative voltage can be generated internally by applying a first voltage, such as the integrated circuit supply voltage, to a first plate of a capacitor while a second plate of the capacitor is held at a second voltage, such as ground. After the capacitor has been charged, the first plate of the capacitor is switched to a third voltage, such as ground, and the second plate of the capacitor is connected to the anti-fuse. The capacitor is preferably charged by a boot circuit including a first inverter having an input receiving a program control signal and an output connected to the first plate of the capacitor. The first inverter couples the first plate of the capacitor to the supply voltage when the program control signal is not active and to ground potential when the program control signal is active. A first switching circuit is connected to the second plate of the capacitor. The first switching circuit couples the second plate of the capacitor to ground potential responsive to a first control signal which is generated by a second inverter. The second inverter has an input receiving the program control signal and an output applying the first control signal to the first switching circuit when the program control signal is not active. A second switching circuit has an input receiving the program control signal. The second switching circuit connects the second plate of the capacitor to the second terminal of the anti-fuse during at least part of the time that the program control signal is active. The boot circuit also preferably includes a clamping circuit connected between the second terminal of the anti-fuse and ground. The clamping circuit prevents the voltage on the second terminal of the anti-fuse from rising substantially above ground potential responsive to the first capacitor being charged through the anti-fuse.

Although the inventive method and apparatus for programming integrated circuit anti-fuses can be used in any type of integrated circuit, it is advantageously used in dynamic random access memories which may be part of a computer system. Also, the inventive method and apparatus may be used to program all types of anti-fuses, including those formed by MOSFET's and those formed by conductive plates separated from each other by a dielectric or insulative material.

DETAILED DESCRIPTION OF THE INVENTION

Figure 1:
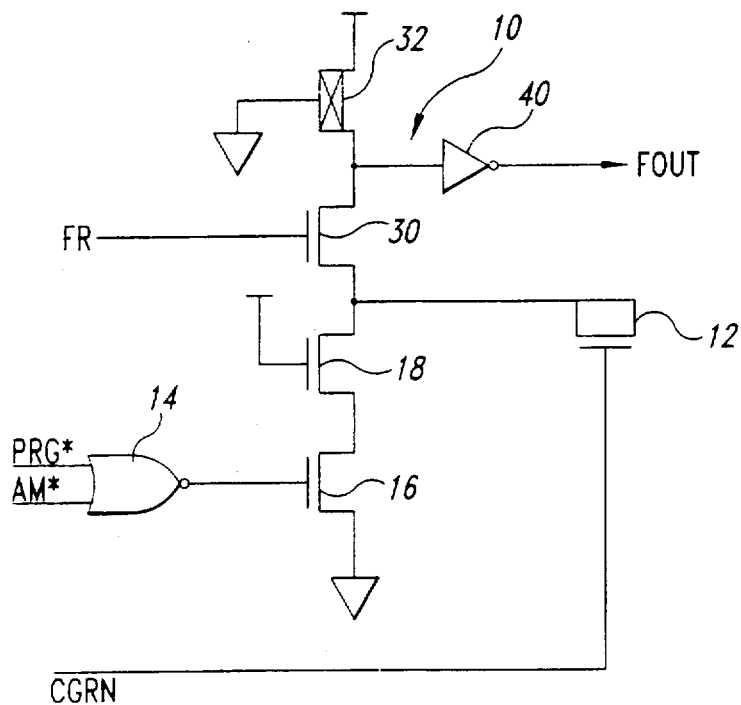
FIG. 1 is a schematic of a prior art circuit for programming and reading an anti-fuse.
Figure 2:
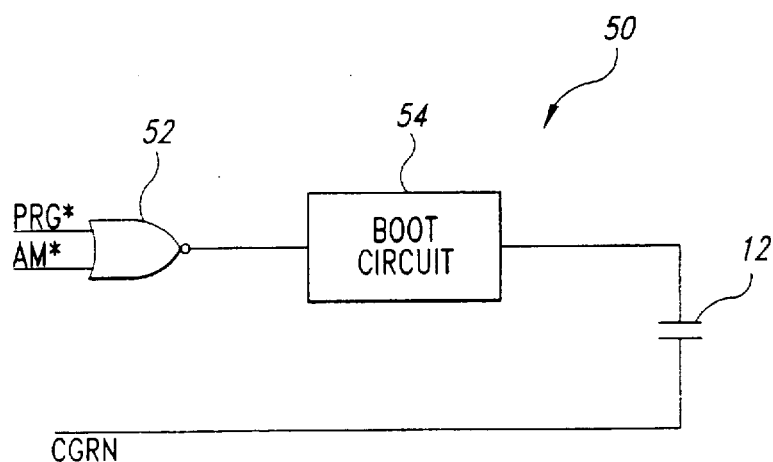
FIG. 2 is block diagram of a preferred embodiment of a system for safely programming an anti-fuse with a relatively high voltage.

A block diagram of a preferred embodiment of the inventive programming system 50 is illustrated in FIG. 2. Like the prior art circuit of FIG. 1, the inventive programming circuit 50 receives and decodes an active low programming input PROG* and an active low address match input AM* using a NOR gate 52. The output of the NOR gate 52 triggers a boot circuit 54 when the anti-fuse 12 is to be programmed, thereby outputting a negative voltage to one plate of the anti-fuse 12. The opposite plate of the anti-fuse 12 is connected to the circuit ground CGRN input of the circuit 50. Significantly, the boot circuit 54 generates the negative voltage internally in the integrated circuit. As a result, the voltage differential across the anti-fuse 12 can be larger than any of the voltages present in the integrated circuit. For example, an 8 volt differential can be placed across the plates of the anti-fuse 12 by applying a 5 volt positive signal to the circuit ground input CGRN and the boot circuit 54 applying a 3 volt negative signal to the other plate of the anti-fuse 12. Significantly, the maximum voltage that would be applied to any other component on the integrated circuit would be 5 volts if the substrate is biased at ground, i.e., 3 volts less than the programming voltage applied to the anti-fuse. As a result, the inventive programming system 50 can consistently program the anti-fuse 12 to a relatively low resistance without endangering other circuitry in the integrated circuit.

Although the preferred embodiment shown in FIG. 2 uses a boot circuit 54 that is triggered by decoding programming and address match signals using a NOR gate, it will be apparent to one skilled in the art that other techniques may be used. For example, a gate other than a NOR gate 52 may be used, and it is not even necessary to use a gate of any type where it is not necessary to decode two or more input signals to indicate that the anti-fuse 12 is to be programmed. Further, although the boot circuit 54 generates a negative voltage, it will be understood that the boot circuit 54 may generate a positive voltage if a negative voltage is applied to the circuit ground CGRN input. Further, voltages of opposite polarity may be generated externally and applied to the anti-fuse 12.

Figure 3:
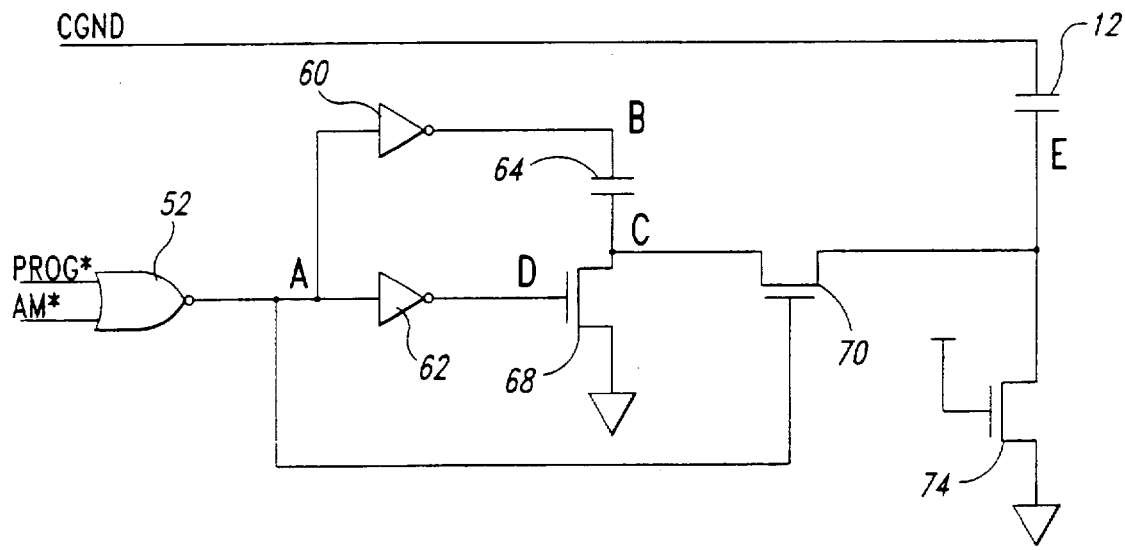
FIG. 3 is a schematic of the preferred embodiment of a circuit for implementing the inventive programming system of FIG. 2.

A preferred embodiment of an anti-fuse programming circuit for implementing the system shown in FIG. 2 is illustrated in FIG. 3. The circuit in FIG. 3 utilizes the NOR gate 52 of FIG. 2 and the anti-fuse 12 of FIG. 2, and these components are therefore designated in FIG. 3 with the same reference numeral. When the anti-fuse 12 is not being programmed, the circuit ground CGND input is at a low potential such as 0 volts. Also, the active low programming input PROG* is high and there is no address match so that the active low address match input AM* is also high. Thus, the output of the NOR gate 52 is low thereby causing the output of each of two inverters 60, 62 to be high. The high at the output of the inverter 60 is applied to one plate of a capacitor 64. The high at the output of the other inverter 62 is applied to the gate of an NMOS transistor 68 thereby turning on the NMOS transistors 68. The transistor 68 then grounds the other plate of the capacitor 64. Thus, when the anti-fuse 12 is not being programmed, the capacitor 64 is charged to the supply voltage.

The low output of the NOR gate 52 is also applied to the gate of another NMOS transistor 70 thereby turning off the NMOS transistor 70. Thus, when the anti-fuse 12 is not being programmed, the NMOS transistor 70 isolates the capacitor 64 and NMOS transistor 68 from the anti-fuse 12. An NMOS transistor 74 is continuously turned on by the supply voltage being applied to its gate, thereby biasing the lower plate of the anti-fuse 12 to ground. The state of the anti-fuse 12 can therefore be read in any of several conventional means when the anti fuse is not being programmed.

When the anti-fuse 12 is to be programmed, the programming input PROG* will go low and appropriate address signals will be applied to the integrated circuit to cause an address match, thereby causing the address match input AM* also to go low. The NOR gate 52 then outputs a high, causing the respective outputs of both inverters 60, 62 to go low. The low at the output of the inverter 60 causes the upper plate of the capacitor 64 to immediately go from the supply voltage to 0 volts. Since the voltage across the capacitor 64 cannot change instantaneously, the voltage on the other plate of the capacitor 64 goes from 0 to a negative voltage. In practice, the voltage on the lower plate of the capacitor 64 will not reach the negative of the supply voltage because it will be clamped by the substrate in most integrated circuit applications. However, the lower plate of the capacitor 64 will nevertheless reach a significant negative voltage.

The low at the output of the inverter 62 turns off the NMOS transistor 68 and the high at the output of the NOR gate 52 turns on the NMOS transistor 70. Thus, the negative voltage on the capacitor 64 is applied to the lower plate of the anti-fuse 12. At the same time, a positive voltage is applied to the circuit ground CGND input, thereby placing a programming voltage across the anti-fuse 12 equal to the difference between the positive programming voltage and the negative voltage on the capacitor 64. This relatively large voltage is sufficient to cause the anti-fuse 12 to be consistently programmed to a relatively low impedance.

During the time that the anti-fuse 12 is being blown, the positive programming voltage from the CGND input is applied to the capacitor 64 through the anti-fuse 12 and the transistor 70. The capacitor 64 will then be charged toward the positive voltage. However, when the voltage on the capacitor 64 is charged to 0 volts, it is clamped there by the NMOS transistor 74 so that the voltage across the anti-fuse 12 will not increase further. The inventive circuit thus maintains a programming voltage of at least the positive voltage applied to the circuit ground CGND input for an indefinite period not related to the charging time of the capacitor 64 while the anti-fuse is being programmed.

After the anti-fuse 12 has been blown, the PROG* and AM* inputs go high, thereby once again charging the capacitor 64 and turning off the NMOS transistor 70 to isolate the capacitor 64 from the anti-fuse 12.

Figure 4A:
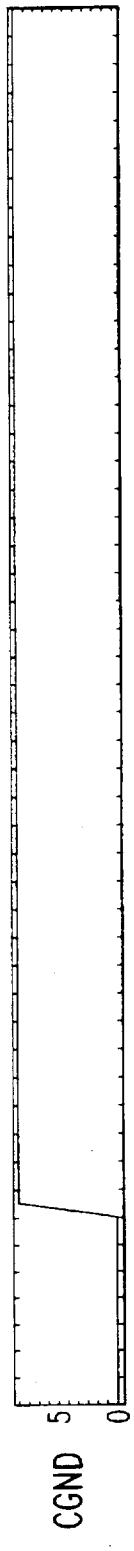
FIGS. 4A–4H are timing diagrams showing waveforms present at various nodes in the circuit of FIG. 3.
Figure 4B:
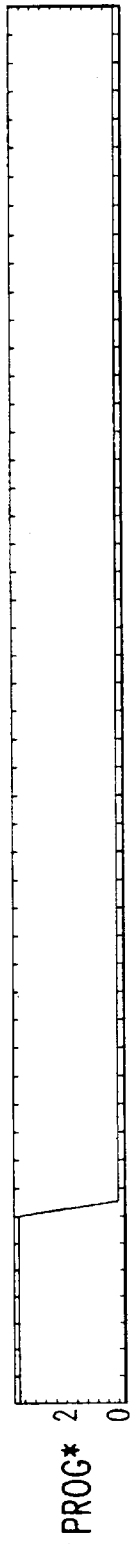
Figure 4C:
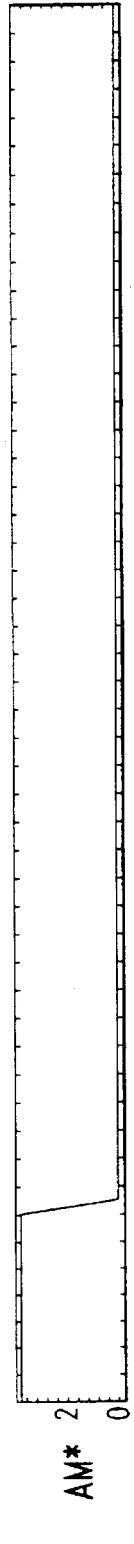
Figure 4D:
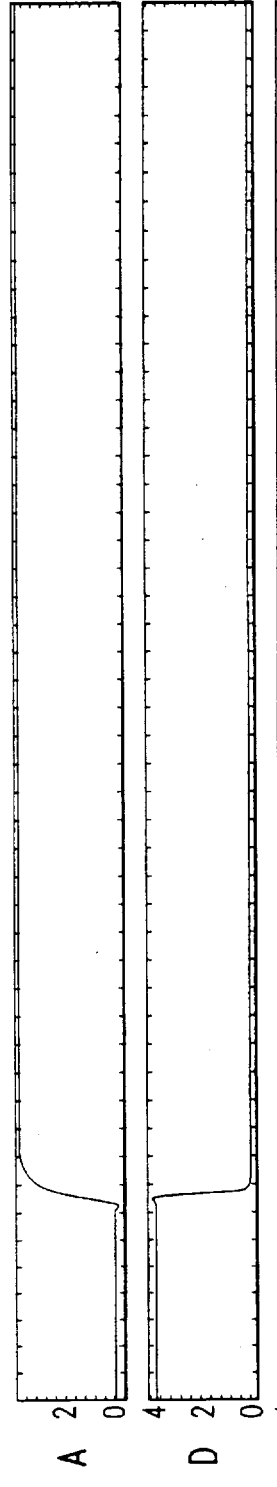
Figure 4E:
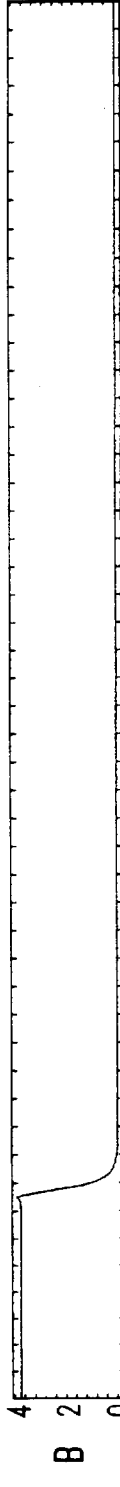
Figure 4F:
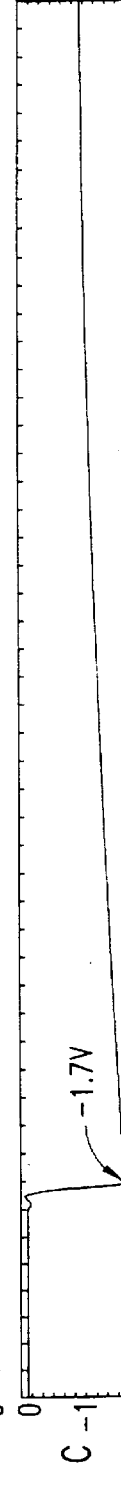
Figure 4G:
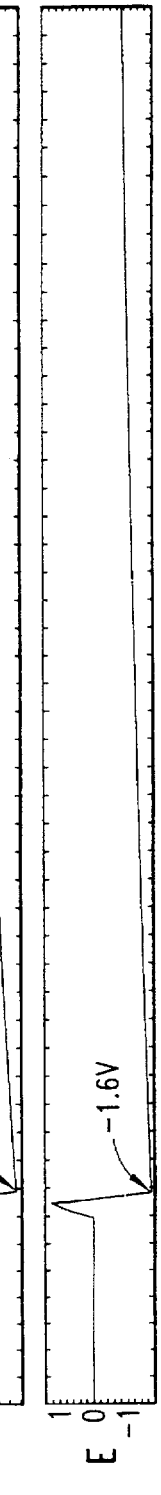
Figure 4H:
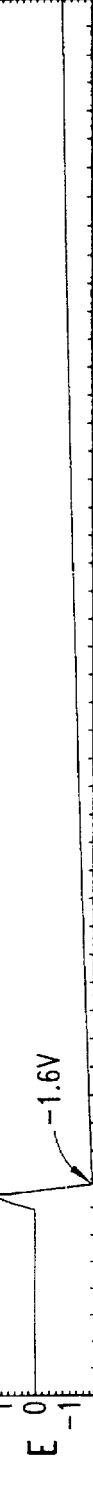

The wave forms present at various nodes in the circuit of FIG. 3 are illustrated in the timing diagrams of FIGS. 4A–H. As shown in FIG. 4A, the circuit ground input CGND goes high from 0 to 9 volts at time $\tau_0$. At the same time, the program input PROG* and the address match AM* each go low, as illustrated in FIGS. 4B and C, respectively. The output of the NOR gate 52, i.e., node A, then goes high as illustrated in FIG. 4D. This low to high transition causes the outputs of the inverters 60, 62, i.e., nodes B and D, respectively, to go low as illustrated in FIGS. 4F and E. The voltage at the lower plate of the capacitor 64, i.e., node C, then follows the output of the inverter 60, as illustrated in FIG. 4G. The voltage on the lower plate of the capacitor 64 falls from 0 volts to approximately −1.7 volts as illustrated in FIG. 4G. Finally, as illustrated in FIG. 4H, the positive going leading edge of CGND (FIG. 4A) is capacitively coupled through the anti-fuse 12 thereby causing the voltage on the lower plate of the anti-fuse 12, i.e., node E, to initially rise. Thereafter, the voltage on the lower plate of the anti-fuse 12 is pulled down by node C to approximately −1.6 volts. It should also be mentioned that the NMOS transistor 74 is a long channel device to provide a sufficiently large resistance so that the transistor 74 does not significantly discharge the capacitor 64. The voltages on the capacitor 64 (node C) and applied to the anti-fuse 12 (node E) increase linearly as the capacitor 64 is charged through the now blown anti-fuse 12. However, the voltage applied to the lower plate of the anti-fuse 12 never increases above 0 volts, as illustrated in FIG. 4H.

Figure 5:
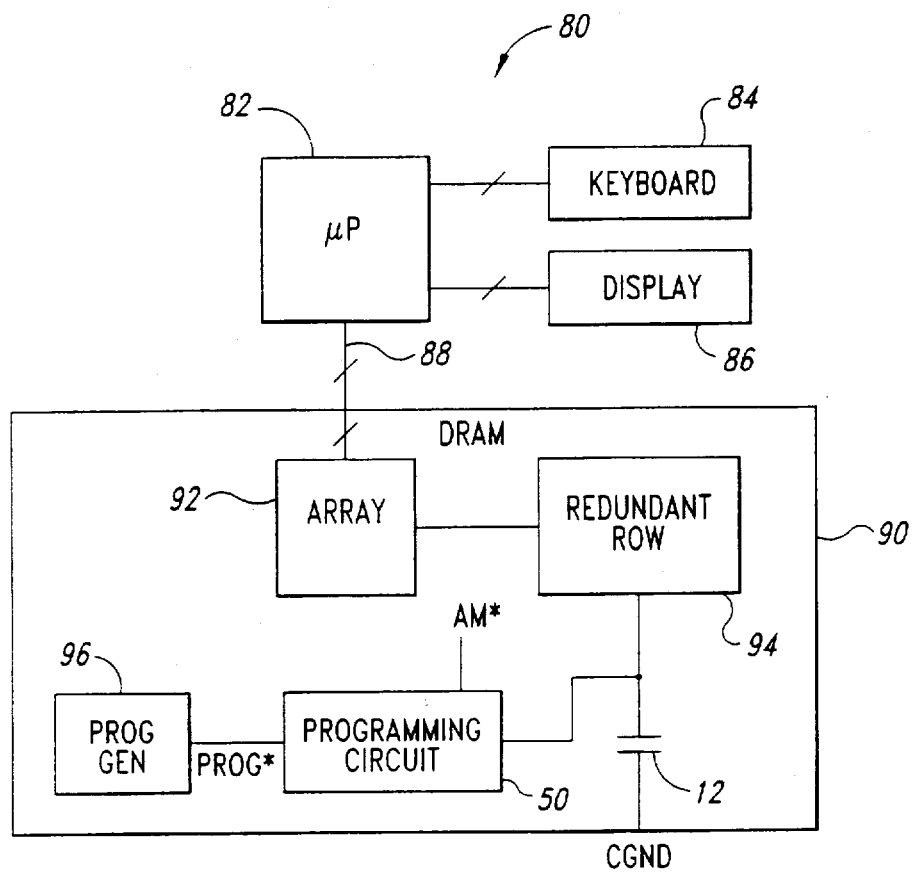
FIG. 5 is a block diagram of a computer system including a dynamic random access memory employing the inventive anti-fuse programming method and apparatus.

A computer system 80 using the inventive programming circuit 50 is illustrated in FIG. 5. The computer system 80 includes a microprocessor 82 of conventional design connected to an input device, such as a keyboard 84, and an output device, such as a display 86. The microprocessor 82 is also connected through a bus system 88 to a dynamic random access memory ("DRAM") 90. As is conventional with the DRAM 90, it includes an array 92 of memory cells and a redundant row of memory cells 94 provided to replace a row of memory cells in the array 92 that is found to be defective. The redundant row 94 has an enable input connected to ground through the anti-fuse 12. The anti-fuse 12 is also connected to the output of the programming circuit 50. As explained above, the programming circuit 50 outputs a negative voltage to the anti-fuse 12 upon receipt of a program input PROG* when the microprocessor 82 outputs a predetermined address which is decoded by conventional circuitry (not shown) to generate an address match AM* signal. The program input PROG* is generated by a program generator 96 in a conventional manner when the anti-fuse 12 is to be programmed. Since the program generator 96 is of conventional design, a detailed description has been omitted for purposes of clarity and brevity. It will be understood by those skilled in the art that the DRAM 90 includes a large amount of additional circuitry. However, this additional circuitry has been omitted for purposes of clarity and brevity.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of programming an anti-fuse fabricated in an integrated circuit, said anti-fuse having first and second terminals, said method comprising:

applying a first voltage to the first terminal of said anti-fuse from a source external to said integrated circuit;

applying a second voltage to the second terminal of said anti-fuse from a source internal to said integrated circuit, said first and second voltages having opposite polarities, said second voltage being generated by applying a third voltage to a first plate of said capacitor while a second plate of said capacitor is held at a fourth voltage, switching the first plate of said capacitor to a fifth voltage, and connecting the second plate of said capacitor to said anti-fuse; and allowing said capacitor to charge through said anti-fuse, and then clamping the voltage on the second plate of said capacitor at a predetermined voltage after said capacitor has charged to said predetermined voltage.

2. The method of claim 1 wherein said anti-fuse is a MOSFET having its drain and its source connected to one of said first and second terminals and its gate connected to the other of said first and second terminals.

3. The method of claim 1 wherein said anti-fuse is formed by first and second conductive plates connected to said first and second terminals, respectively, said plates being separated from each other by a non-conductive material.

4. The method of claim 1 wherein said second voltage is substantially equal to the negative of a supply voltage, said third voltage is substantially equal to the supply voltage, and said fourth and fifth voltages are substantially equal to zero volts.

5. A programming circuit for programming an anti-fuse having first and second terminals, said programming circuit and said anti-fuse being fabricated in a common integrated circuit powered by a supply voltage, said programming circuit comprising:

an externally accessible terminal connected to the first terminal of said anti-fuse, said externally accessible terminal adapted to receive a first programming voltage of a predetermined polarity; and a boot circuit connected to the second terminal of said anti-fuse, said boot circuit generating from a supply voltage a second programming voltage having a polarity opposite the polarity of said first programming voltage responsive to a program input signal whereby a voltage corresponding to the difference between said first and second programming voltages is applied across the first and second terminals of said anti-fuse, the boot circuit comprising:

a capacitor having first and second plates;

a first inverter having an input receiving a program control signal and an output connected to the first plate of said capacitor, said first inverter coupling the first plate of said capacitor to said supply voltage when said program control signal is not active and to ground potential when said program control signal is active;

a first switching circuit connected to the second plate of said capacitor, said first switching circuit coupling the second plate of said capacitor to ground potential responsive to a first control signal;

a second inverter having an input receiving said program control signal and an output connected to said first switching circuit, said second inverter applying said first control signal to said first switching circuit when said program control signal is not active; and a second switching circuit having an input receiving said program control signal, said second switching circuit connecting the second plate of said capacitor to the second terminal of said anti-fuse during at least part of the time that said program control signal is active.

6. The programming circuit of claim 5 wherein said first programming voltage is of a positive polarity and said second programming voltage is of a negative polarity.

7. The programming circuit of claim 5 wherein said boot circuit further includes a clamping circuit connected between the second terminal of said anti-fuse and ground, said clamping circuit preventing the voltage on the second terminal of said anti-fuse from rising substantially above ground potential responsive to said first capacitor being charged through said anti-fuse.

8. The programming circuit of claim 5 wherein said anti-fuse is a MOSFET having its drain and its source connected to one of said first and second terminals and its gate connected to the other of said first and second terminals.

9. The programming circuit of claim 5 wherein said anti-fuse is formed by first and second conductive plates connected to said first and second terminals, respectively, said plates being separated from each other by a non-conductive material.

10. A dynamic random access memory fabricated on an integrated circuit powered by a supply voltage, comprising:

an array of memory cells arranged in rows and columns;

an anti-fuse having first and second terminals;

a functional circuit coupled to said anti-fuse, said functional circuit being enabled responsive to programming said anti-fuse; and a programming circuit for programming said anti-fuse, said programming circuit including an externally accessible terminal connected to the first terminal of said anti-fuse, said externally accessible terminal adapted to receive a first programming voltage of a predetermined polarity, said programming circuit further including a boot circuit connected to the second terminal of said anti-fuse, said boot circuit generating from supply voltage a second programming voltage having a polarity opposite the polarity of said first programming voltage responsive to a program input signal whereby a voltage corresponding to the difference between said first and second programming voltages is applied across the first and second terminals of said anti-fuse to enable said functional circuit, said boot circuit comprising:

a capacitor having first and second plates;

a first inverter having an input receiving a program control signal and an output connected to the first plate of said capacitor, said first inverter coupling the first plate of said capacitor to said supply voltage when said program control signal is not active and to ground potential when said program control signal is active;

a first switching circuit connected to the second plate of said capacitor, said first switching circuit coupling the second plate of said capacitor to ground potential responsive to a first control signal;

a second inverter having an input receiving said program control signal and an output connected to said first switching circuit, said second inverter applying said first control signal to said first switching circuit when said program control signal is not active; and a second switching circuit having an input receiving said program control signal, said second switching circuit connecting the second plate of said capacitor to the second terminal of said anti-fuse during at least part of the time that said program control signal is active.

11. The dynamic random access memory of claim 10 wherein said first programming voltage is of a positive polarity and said second programming voltage is of a negative polarity.

12. The dynamic random access memory of claim 10 wherein said boot circuit further includes a clamping circuit connected between the second terminal of said anti-fuse and ground, said clamping circuit preventing the voltage on the second terminal of said anti-fuse from rising substantially above ground potential responsive to said first capacitor being charged through said anti-fuse.

13. The dynamic random access memory of claim 10 wherein said functional circuit includes a plurality of redundant memory cells that are activated to replace memory cells in said array when said anti-fuse is programmed.

14. A computer system, comprising:

a processor;

an input device;

an output device; and a dynamic random access memory ("DRAM") fabricated on an integrated circuit powered by a supply voltage, said DRAM including an array of memory cells arranged in rows and columns, an anti-fuse having first and second terminals, a functional circuit coupled to said anti-fuse and said array of memory cells, said functional circuit being enabled responsive to programming said anti-fuse, and a programming circuit for programming said anti-fuse, said programming circuit including an externally accessible terminal connected to the first terminal of said anti-fuse, said externally accessible terminal adapted to receive a first programming voltage of a predetermined polarity, said programming circuit further including a boot circuit connected to the second terminal of said anti-fuse, said boot circuit generating from supply voltage a second programming voltage having a polarity opposite the polarity of said first programming voltage responsive to a program input signal whereby a voltage corresponding to the difference between said first and second programming voltages is applied across the first and second terminals of said anti-fuse to enable said functional circuit, said boot circuit comprising:

a capacitor having first and second plates;

a first inverter having an input receiving a program control signal and an output connected to the first plate of said capacitor, said first inverter coupling the first plate of said capacitor to said supply voltage when said program control signal is not active and to ground potential when said program control signal is active;

a first switching circuit connected to the second plate of said capacitor, said first switching circuit coupling the second plate of said capacitor to ground potential responsive to a first control signal;

a second inverter having an input receiving said program control signal and an output connected to said first switching circuit, said second inverter applying said first control signal to said first switching circuit when said program control signal is not active; and a second switching circuit having an input receiving said program control signal, said second switching circuit connecting the second plate of said capacitor to the second terminal of said anti-fuse during at least part of the time that said program control signal is active.

15. The computer system of claim 14 wherein said input device is a keyboard.

16. The computer system of claim 14 wherein said output device is a display.

17. The computer system of claim 14 wherein said functional circuit includes a plurality of redundant memory cells that are activated to replace memory cells in said array when said anti-fuse is programmed.

18. The computer system of claim 14 wherein said first programming voltage is of a positive polarity and said second programming voltage is of a negative polarity.

19. The computer system of claim 14 wherein said boot circuit further includes a clamping circuit connected between the second terminal of said anti-fuse and ground, said clamping circuit preventing the voltage on the second terminal of said anti-fuse from rising substantially above ground potential responsive to said first capacitor being charged through said anti-fuse.

* * * * *